United States Patent [19]
Burt et al.

[11] Patent Number: 4,811,106
[45] Date of Patent: Mar. 7, 1989

[54] FRAME TRANSFER IMAGE SENSOR HAVING TWO VERTICAL CLOCK STANDARDS

[75] Inventors: David J. Burt, London; Raymond T. Bell, Stanmore, both of England

[73] Assignee: The General Electric Company, p.l.c., England

[21] Appl. No.: 47,719

[22] Filed: May 5, 1987

[30] Foreign Application Priority Data

May 16, 1986 [GB] United Kingdom ............... 8611962

[51] Int. Cl.$^4$ .......................................... H04N 3/14
[52] U.S. Cl. ........................ 358/213.26; 358/213.25
[58] Field of Search ................... 358/213.26, 213.27, 358/213.22, 140, 180, 213.25, 213.16

[56] References Cited
U.S. PATENT DOCUMENTS 4,426,664 1/1984 Nagumo et al. ............... 358/213.26
4,567,524 1/1986 Levine .......................... 358/213.26
4,575,763 3/1986 Elabd ............................ 358/213.26

Primary Examiner—Jin F. Ng
Assistant Examiner—Stephen Brinich
Attorney, Agent, or Firm—Kirschstein, Kirschstein, Ottinger & Israel

[57] ABSTRACT

A charge coupled device (CCD) image sensor for producing a video output for a given TV line standard wherein the image section (9) has a number of CCD elements appropriate to the given line standard and the store section (11) has a number of CCD elements appropriate to a second, higher line standard. The electronic package required to drive the sensor is then not very different from an electronic package required to drive a sensor for the higher line standard, thus making it practicable to use in the sensor an electronic package capable of use in sensors for either standard.

2 Claims, 1 Drawing Sheet

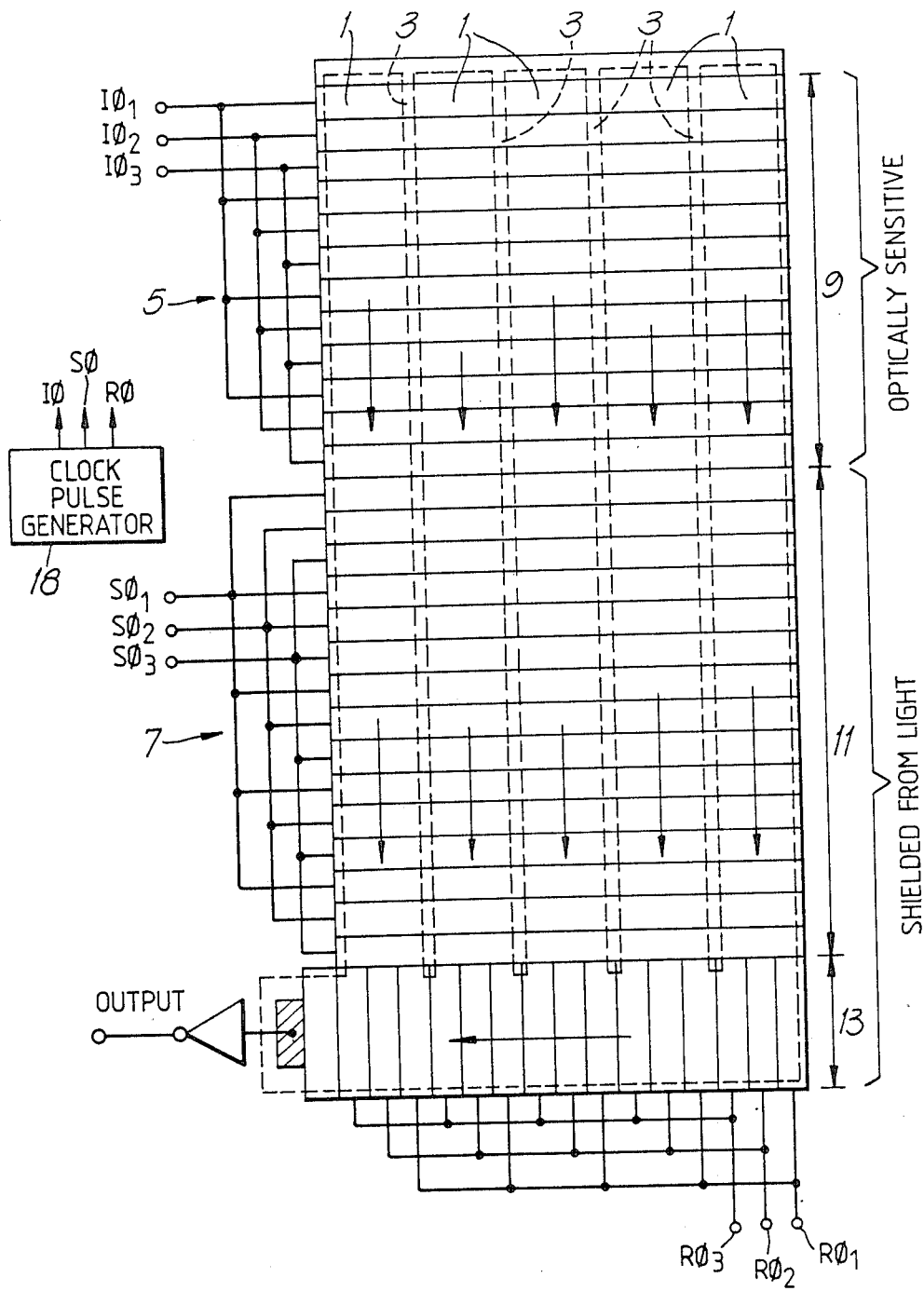

FRAME TRANSFER IMAGE SENSOR HAVING TWO VERTICAL CLOCK STANDARDS

This invention relates to image sensors. More particularly the invention relates to charge coupled device (CCD) frame transfer image sensors.

In CCD frame transfer image sensors, light representing an image is focussed onto a photo-sensitive first portion of an array of CCD channels comprising an image section of the array. A second portion of the array of CCD channels which is non photo-sensitive, e.g. due to being shielded from light, comprises a store section. Adjacent to the store section there is provided a line read-out section. A frame of charge photogenerated in the image section is transferred to the store section by applying clock pulses to the control electrodes of both sections, and is then read out in sequential line-by-line fashion by applying clock pulses to the control electrodes of both store and line read-out sections. Normally a frame of charge is read out of the store section whilst a further frame is being collected in the image section, and so on.

In known CCD frame transfer image sensors the number of charge storage locations in each channel of the array in the image section and in the store section, is appropriate to the line standard of the raster scan format to which the sensor output signal is required to conform, i.e. not less than the number of active lines in each field of the raster scan format. Thus for a 625 line standard output the number of storage elements in each channel in each of the image and store section is at least 288, and for a 525 line standard output, is at least 244, it being sometimes convenient for the number of locations to be slightly larger than the minimum required by the line standard for one purpose or another, especially in the store section. As a consequence, the arrangement for producing clock pulses for application to the control electrodes of a CCD frame transfer image sensor which produces output signals of one line standard differs appreciably from the arrangement required in a sensor for another line standard. It is thus difficult to design a satisfactory clock pulse generator package for use in CCD frame transfer image sensors which is capable of easily being adapted for use in sensors for different established line standards. It will be appreciated that such a package would reduce manufacturing costs where it is desired to manufacture sensors for different established line standards or sensors capable of being selectively operated to produce signals of different line standards.

It is an object of the present invention to provide a CCD frame transfer image sensor whereby this problem is alleviated.

According to the present invention in a CCD frame transfer image sensor comprising: an image section comprising a photo-sensitive portion of an array of CCD channels; a store section comprising a non photo-sensitive portion of said array of CCD channels; a line read-out section adjacent to the store section; a control electrode structure associated with said image, store, and read-out sections; and means for applying pulses to the control electrode structure so as to transfer charge generated in the image section along the channels into the store section, and to read out charge stored in said store via said read-out section; the number of charge storage locations in each channel of the array in the image section is appropriate to a first established line standard; the number of charge storage locations in each channel of the array in the store section is appropriate to a second established line standard having a higher number of lines than said first standard; and said means for applying pulses, to transfer charge from the image section to the store section, applies to the parts of the control electrode structure associated with the image and store sections, a sequence of pulses appropriate to said second line standard, and to read out charge stored in the store section via the read-out section, applies to the parts of the control electrode structure associated with the store and read-out sections a sequence of pulses appropriate to said first line standard.

It will be appreciated that since the means for applying pulses of a sensor according to the invention already produces a sequence of pulses suitable for transferring charge from the image section to the store section of a CCD frame transfer image sensor for producing signals conforming to said second line standard, it can, without undue extra expense, be made so as to be adapted to provide all the pulse sequences required for operating a CCD frame transfer image sensor producing signals conforming to said second line standard.

One CCD frame transfer image sensor in accordance with the invention will now be described, by way of example only, with reference to the accompanying drawing which is a schematic diagram of the sensor.

Referring firstly to the FIGURE, the sensor includes an array having a number of charge transfer CCD channels 1 arranged side by side. In the FIGURE only five such channels 1 are shown for simplicity. The array is fabricated in known manner on a silicon substrate, adjacent channels being isolated from each other by channel stop regions in the substrate, represented by dotted lines 3 in the FIGURE. Charge storage locations within each channel 1 are defined by a three-phase electrode structure 5, 7 the storage locations within the different channels being aligned to form a rectangular array of charge storage elements. One part of the array, the upper part in the FIGURE, is open to incoming light, and forms the image section 9 of the sensor, whilst the other part of the array, the lower part in the FIGURE, is shielded from the light, and forms the store section 11 of the sensor. At one end of the store section 11, the lower end in the FIGURE, there is a line read-out section 13. The sensor also includes clock pulse generating means 18 effective to apply clock pulses to the electrode structure of the image, store and read-out sections.

In use an optical image is focussed onto the image section 9 of the sensor, and a charge pattern corresponding to the image is generated by the photo-electric effect in the storage locations underlying the image. A frame of charge thus generated over a period of time, the integration period, in the charge storage locations of the image section 9, is by application of clock pulses $I\phi_1, I\phi_2, I\phi_3$ to the electrode structure 5 and clock pulses $S\phi_1, S\phi_2$ and $S\phi_3$ to the electrode structure 7, transferred quickly to the store section 11. This is then read out sequentially line by line, through the line read-out section 13 by application of further clock pulses $S\phi_1, S\phi_2, S\phi_3$, to the store section electrode structure 7, and $R\phi_1, R\phi_2, R\phi_3$ to the read-out section electrode structure, to produce the output signal of the sensor.

During read-out a further frame of charge is generated in the image section 9 which after read-out is transferred to the store section 11, and then read out, and so on.

The number of charge storage locations in the part of each channel 1 in the image section 9 of the array is appropriate to a first established line standard to which the output signal of the sensor is required to conform. For example, if the output signal is required to conform to a 525 line standard the number of locations per channel is 244, the number of active lines in each field of a 525 line standard frame being 244.

The number of charge storage locations in the part of each channel 1 in the store section 11 of the array is appropriate to a second, higher established line standard e.g. 288, as appropriate to the 625 line standard.

It will be appreciated that each storage location is defined by three adjacent electrodes of the associated electrode structure 5 or 7, and that in the drawing a small number of locations only is shown for the sake of clarity.

The pulse sequences applied to the electrode structure 5 and 7 of the image and store sections 9 and 11 to transfer charge from the image section 9 to the store section 11 are as required by a conventional sensor for the higher, second line standard. Consequently, at the end of charge transfer, the charge pattern in the store section 11 occupies the lower lines only, e.g. lower 244 lines only, leaving some empty lines, e.g. 44, of charge storage locations between the stored charge pattern and the image section 9.

The pulse sequences applied to the electrode structure 7 of the store section 11 and the electrode structure of the read-out section 13 during read-out are as required by a conventional sensor for the lower, first line standard, so that a signal conforming to the lower line standard appears at the output of the sensor.

As explained above the clock pulse generating means 18 applies to the electrode structure 5, 7 for transfer of the generated charge storage pattern from the image section 9 to the store section 11, sequences of pulses suitable for the same purpose in a sensor for the higher line standard. Hence to be usable in a sensor for producing an output signal conforming to the higher line standard, the generator 18 only needs to be also capable of producing, or of being adapted to produce, the signals required for read-out from the store section via the read-out section of a higher line standard sensor.

Consequently, it is a practical proposition in the sensor described by way of example to use for the clock pulse generating means 18 a package which is capable of, or of being adapted for, use also in a sensor for the higher line standard.

It will be appreciated that a sensor of a configuration according to the invention also simplfies the equipment required for testing when it is desired to manufacture sensors conforming to two or more different established line standards.

We claim:

1. A CCD frame transfer image sensor comprising: an image section comprising a photo-sensitive portion of an array of CCD channels; a store section comprising a non photo-sensitive portion of said array of CCD channels; a line read-out section adjacent to the store section; a control electrode structure associated with said image, store, and read-out sections; and means for applying pulses to the control electrode structure so as to transfer charge generated in the image section along the channels into the store section, and to read-out charge stored in said store section via said read-out section; wherein the number of charge storage locations in each channel of the array in the image section is appropriate to a first established line standard; the number of charge storage locations in each channel of the array in the store section is appropriate to a second established line standard having a higher number of lines than said first standard; and said means for applying pulses, to transfer charge from the image section to the store section, applies to the parts of the control electrode structure associated with the image and store sections a sequence of pulses appropriate to said second line standard, and to read-out charge stored in the store section via the read-out section, applies to the parts of the control electrode structure associated with the store and read-out sections a sequence of pulses appropriate to said first line standard.

2. A sensor according to claim 1 wherein said first line standard is a 525 line standard and said second line standard is a 625 line standard.

* * * * *